United States Patent
Choi (10) Patent No.: US 9,696,941 B1
(45) Date of Patent: Jul. 4, 2017

(54) MEMORY SYSTEM INCLUDING MEMORY BUFFER

(71) Applicant: SK hynix Inc., Icheon-si, Gyeonggi-do (KR)

(72) Inventor: Won-Ha Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/296,216

(22) Filed: Oct. 18, 2016

(30) Foreign Application Priority Data

Jul. 11, 2016 (KR) .......................... 10-2016-0087258

(51) Int. Cl.
*G06F 3/06* (2006.01)
*G11C 8/00* (2006.01)

(52) U.S. Cl.
CPC ............ *G06F 3/0656* (2013.01); *G06F 3/061* (2013.01); *G06F 3/0683* (2013.01); *G11C 8/00* (2013.01)

(58) Field of Classification Search
CPC .... G11F 7/1006; G06F 3/0656; G06F 3/0683; G06F 3/061; G11C 8/00
See application file for complete search history.

(56) References Cited

U.S. PATENT DOCUMENTS

2004/0264286 A1* 12/2004 Ware .................... G11C 7/1006
365/232
2008/0183959 A1 7/2008 Pelley et al.

FOREIGN PATENT DOCUMENTS

KR 1020160004346 A 1/2016

* cited by examiner

*Primary Examiner* — Harry W Byrne
*Assistant Examiner* — Ajay Ojha
(74) *Attorney, Agent, or Firm* — William Park & Associates Ltd.

(57) ABSTRACT

A memory system may include a memory module accessed by a first address, a memory controller configured to provide a read or write command for the memory module according to a host request, and a memory buffer accessed by a second address. The memory buffer may include a register file having two or more entry spaces corresponding to interleaving units of the memory module, and the two or more entry spaces may be positioned in different address areas which are accessible at the same time.

20 Claims, 9 Drawing Sheets

| | |
|---|---|
| Entry0 | 512B (4Kb) for rank 0, BG 0, bank 0 |
| Entry1 | 512B (4Kb) for rank 0, BG 0, bank 1 |
| Entry2 | 512B (4Kb) for rank 0, BG 0, bank 2 |
| Entry3 | 512B (4Kb) for rank 0, BG 0, bank 3 |
| Entry4 | 512B (4Kb) for rank 0, BG 1, bank 0 |
| Entry5 | 512B (4Kb) for rank 0, BG 1, bank 1 |
| Entry6 | 512B (4Kb) for rank 0, BG 1, bank 2 |
| Entry7 | 512B (4Kb) for rank 0, BG 1, bank 3 |
| ... | ... |
| Entry28 | 512B (4Kb) for rank 1, BG 3, bank 0 |
| Entry29 | 512B (4Kb) for rank 1, BG 3, bank 1 |
| Entry30 | 512B (4Kb) for rank 1, BG 3, bank 2 |
| Entry31 | 512B (4Kb) for rank 1, BG 3, bank 3 |

| C2 = (number of column bits of Memory Module − C1 − C0) | C1 = $\log_2$(number of banks of HBM) | C0 = $\log_2$(burst length of Memory Module) |
|---|---|---|

(B)

| R2 = (number of row bits of Memory Module − R1 − R0) | R1 = number of row bits of HBM − $\log_2$(number of interleaving units) | R0 = $\log_2$(page size of HBM (KB)) − $\log_2$(burst length of Memory Module X data width of module (B)) − C2 |
|---|---|---|

MEMORY SYSTEM INCLUDING MEMORY BUFFER

CROSS-REFERENCE TO RELATED APPLICATIONS

The present application claims priority of Korean Patent Application No. 10-2016-0087258, filed on Jul. 11, 2016, which is incorporated herein by reference in its entirety.

BACKGROUND

1. Field of the Invention

Exemplary embodiments of the present disclosure relate to a memory system including a memory buffer, and more particularly, to a memory system including a memory buffer, that is capable of preventing performance degradation which may occur in a data read/write operation for a memory module.

2. Description of the Related Art

Figure 1:
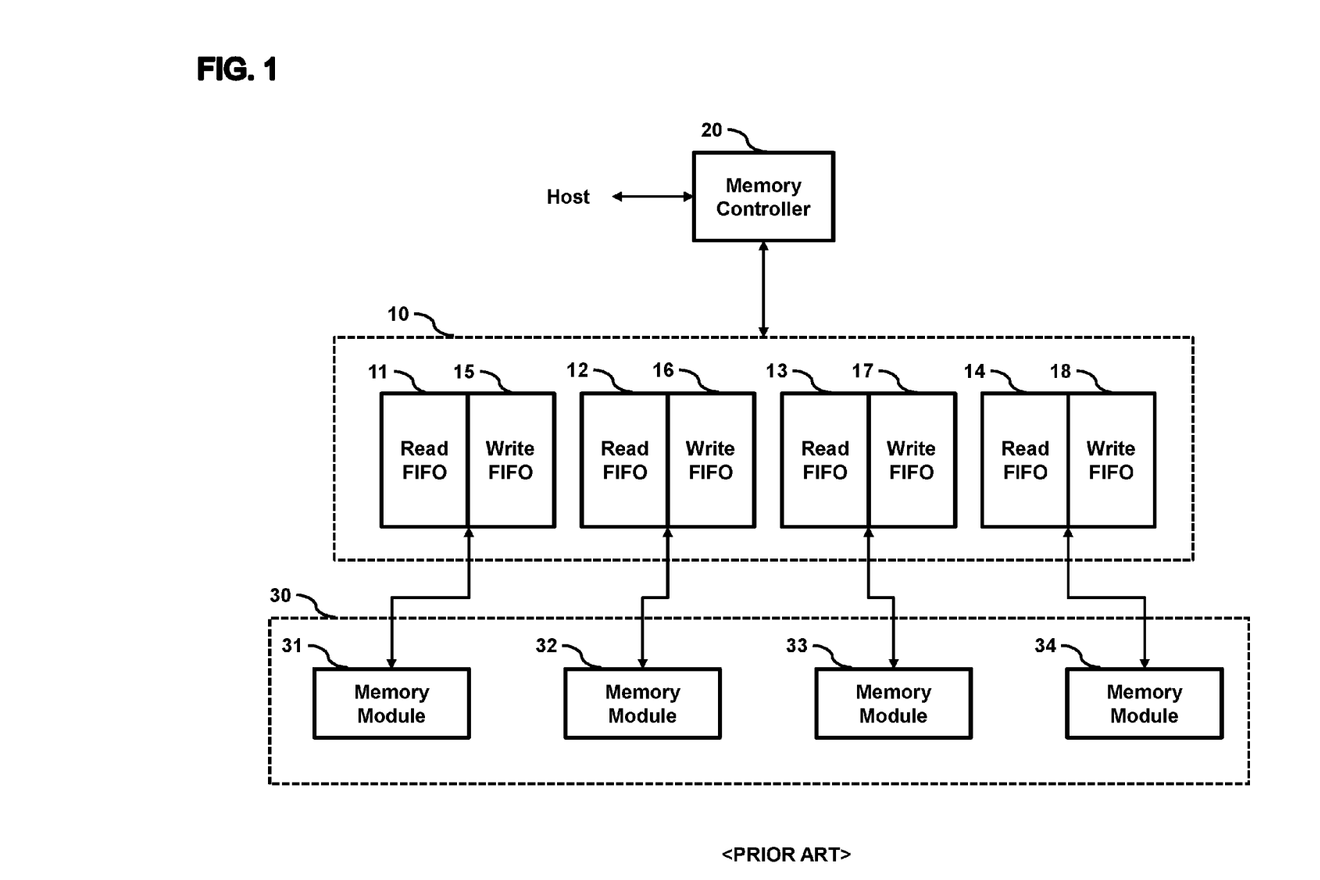
FIG. 1 is a block diagram of a conventional memory system.

FIG. 1 is a block diagram of a conventional memory system.

The conventional memory system includes a memory buffer 10, a plurality of memory modules 31 to 34, and a memory controller 20 for controlling a read/write operation of the plurality of memory modules 31 to 34 through the memory buffer 10.

The plurality of memory modules 31 to 34 are included in one memory space 30.

The memory buffer 10 includes a plurality of read FIFOs 11 to 14 and a plurality of write FIFOs 15 to 18.

Each of the read FIFOs 11 stores data read from the corresponding memory module 31, and the data stored in the read FIFO 11 are provided to the memory controller 20.

Each of the write FIFOs 15 stores data received from the memory controller 20, and the data stored in the write FIFO 15 are written to the corresponding memory module 31.

In the memory buffer 10 of the conventional memory system, the read FIFOs 11 and the write FIFOs 15 only serve to temporarily store data when a read request or write command is processed.

Thus, when performance degradation occurs in reading data from a memory module 31 or writing data to a memory module 31, the performance degradation of the memory system cannot be prevented even though the memory buffer 10 exists.

For example, the memory module 31 of FIG. 1 includes a plurality of DRAM chips, and each of the DRAM chips includes a plurality of banks.

In order to perform a read request for two different row addresses included in one bank of the DRAM chip, active-read-precharge operations must be performed on one row address, and active-read operations must be performed on the other row address.

Thus, when a read operation is performed on a plurality of row addresses belonging to the same bank, the read time is inevitably increased.

Therefore, when row addresses included in the same bank of a DRAM chip are successively accessed, performance improvement cannot be expected. Such a problem may occur even during a write operation.

Thus, there is a demand for a memory system including a new memory buffer that is capable of reducing performance degradation which may occur when data is read from or written to the memory module 31.

SUMMARY

Various embodiments are directed to a memory system including a memory buffer capable of preventing performance degradation during a read or write operation for a memory module.

In an embodiment, a memory system may include a memory module accessed by a first address, a memory controller configured to provide a read or write command for the memory module according to a host request, and a memory buffer accessed by a second address. The memory buffer may include a register file having two or more entry spaces corresponding to interleaving units of the memory module, and the two or more entry spaces may be positioned in different address areas which are accessible at the same time.

DETAILED DESCRIPTION

Hereafter, various embodiments will be described below in more detail with reference to the accompanying drawings.

Figure 2:
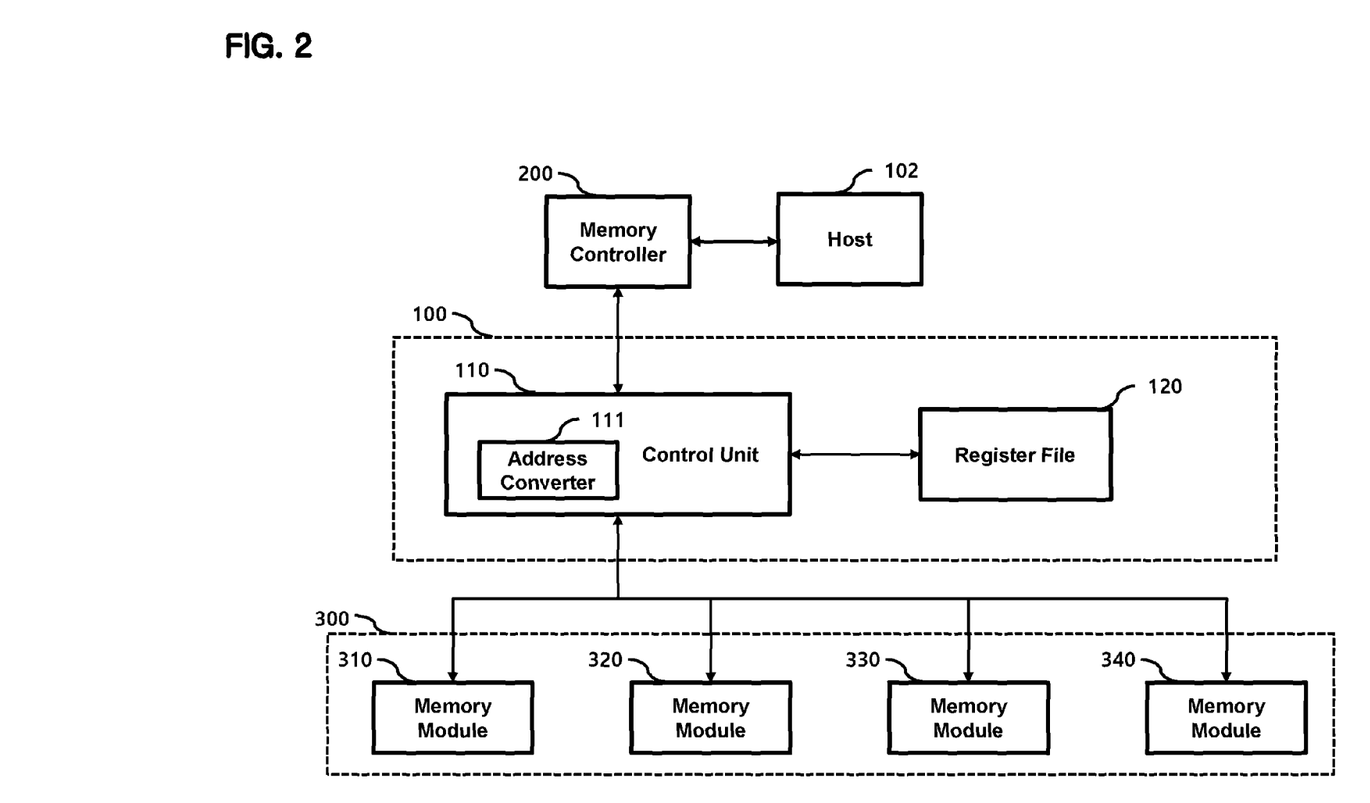
FIG. 2 is a block diagram of a memory system in accordance with an embodiment.

FIG. 2 is a block diagram of a memory system in accordance with an embodiment.

The memory system in accordance with the present embodiment includes a memory controller 200, a memory buffer 100, and a plurality of memory modules 310 to 340. Although four memory modules 310 to 340 are depicted in FIG. 2, other embodiments may include fewer or more memory modules.

The plurality of memory modules 310 to 340 may be included in one memory space 300, and the storage spaces of all of the memory modules 310 to 340 may be accessed through a first address.

That is, the first address designates any one cell among all the memory cells of the memory modules 310 to 340.

The memory controller 200 controls a read/write operation for providing a read or write command for the memory modules 310 to 340 using the first address, according to a read/write command of a host 102.

In the present embodiment, each of the memory modules 310 to 340 may have a memory module structure such as SIMM (single in-line memory module) or DIMM (dual in-line memory module). In other embodiments, one or more of the memory modules 310 to 340 may be a DDR (double data rate) memory module.

The first address may be divided into a first rank address, a first bank address, a first row address, and a first column address.

In the present embodiment, the memory buffer 100 includes a control circuit, control processor, or in other words, a control unit 110, and a register file 120.

The memory buffer 100 may include memory such as DRAM in which a plurality of cell dies and a logic die are stacked.

The plurality of cell dies may correspond to the register file 120, and the logic die may correspond to the control unit 110.

For example, the memory buffer 100 may be implemented with a memory such as an HBM (High-Bandwidth Memory).

The control unit 110 generates a read/write command for the register file 120 using one or more second addresses of the register file 120. Accordingly, the control unit 110 controls a read/write operation for the register file 120 according to one or more second addresses of the register file 120.

The second addresses of the register file 120 are converted to the first addresses of the memory modules 310 to 340.

The control unit 110 includes an address converter 111 for converting a first address and a second address. The memory buffer 100 may be accessed by the second address.

As described with reference to FIG. 1, the read FIFOs and the write FIFOs which correspond to the respective memory modules are physically distinguished from each other in the memory buffer of a conventional memory system.

In the present embodiment, however, the entire register file 120 is used for all the memory modules 310 to 340 through the method of converting second addresses of the register file 120 to first addresses of the memory modules 310 to 340 and vice-versa.

In the present embodiment, the address converter 111 may convert two first addresses which cannot be simultaneously accessed in the memory modules 310 to 340, to two second addresses which can be accessed simultaneously in the register file 120.

For example, when the memory modules are implemented with DRAM chips, the first two addresses having the same first rank address and the same first bank address cannot be accessed in the memory modules 310 to 340 at the same time. As described above, a row active operation, a read/write operation, and a row precharge operation (row active→read/write→row precharge) need to be sequentially performed to access the addresses.

In this case, a combination of one rank address and one bank address corresponds to one interleaving unit.

The address converter 111 converts the two first addresses having the same first rank address and the same first bank address into two second addresses which can be accessed in the register file 120 at the same time.

For example, when the register file 120 includes a plurality of banks, the address converter 111 may convert the two first addresses into two second addresses associated with different banks.

The address conversion method in accordance with the present embodiment will be described in detail with reference to FIG. 3.

The control unit 110 may buffer a read/write command for the memory modules 310 to 340, outputted from the memory controller 200, and output the buffered read/write command to the memory modules 310 to 340.

The control unit 110 may generate a command for the register file 120 in response to the read/write command for the memory modules 310 to 340 and output the generated command to the register file 120.

When the control unit 110 outputs the generated command to the memory modules 310 to 340, the control unit 110 may simultaneously or sequentially output the command for the memory modules 310 to 340 and the command for the register file 120.

For example, when an entry space corresponding to the memory modules 310 to 340 exists in the register file 120, the control unit 110 may simultaneously or sequentially provide a write command for the register file 120 and a write command for the memory modules 310 to 340, and thus maintain consistency of data at the same address.

In another embodiment, the memory controller 200 may provide a command for both the memory modules 310 to 340 and a corresponding command for the register file 120.

At this time, the control unit 110 may buffer the command for the memory modules 310 to 340 and provide the buffered command to the memory modules 310 to 340, or buffer the command for the register file 120 and provide the buffered command to the register file 120.

For example, if the control unit 110 determines that an entry space of a second address corresponding to a first address of the memory space 300 exists in the register file 120, the control unit 110 may inform the memory controller 200 that the entry space of the second address corresponding to the first address exists in the register file 120 and the memory controller 200 may selectively provide the command for the register file 120 in place of the command for the memory modules 310 to 340, or provide commands to the register file 120 and the memory modules 310 to 340. In one example, when the second address corresponding to the first address exists in the register file 120, the control unit 110 performs a read or write command on the register file 120. On the other hand, when the second address corresponding to the first address does not exist in the register file 120, the control unit 110 converts one address of the two or more entry spaces corresponding to the first address into the second address.

Figure 3:
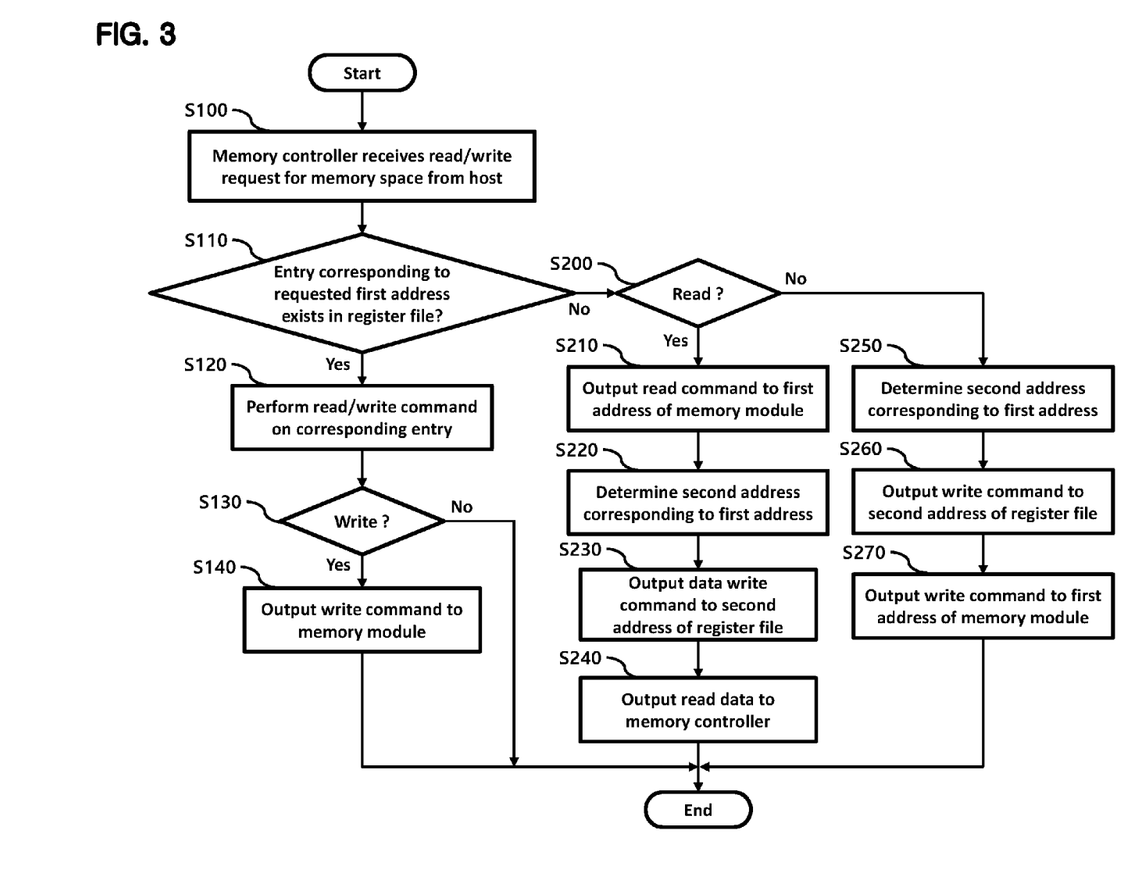
FIG. 3 is a flowchart illustrating a read/write processing operation of the memory system of FIG. 2.

FIG. 3 is a flowchart illustrating a read/write processing operation of the memory system of FIG. 2.

The memory controller 200 receives a read/write command for the memory space 300 from a host 102 at step S100.

The control unit 110 checks whether an entry space corresponding to a requested first address exists in the register file 120, at step S110.

If the entry space exists, the control unit 110 provides a read/write command for the corresponding entry space at step S120.

At this time, the read/write command is related to the register file 120. As described above, this command may be generated by the control unit 110 or generated by the memory controller 200. Hereafter, the same configuration is applied.

Then, the control unit 110 determines whether the command is a write command, at step S130.

If the command is not a write command, the control unit 110 ends the operation. If the command is a write command, the control unit 110 outputs a write command to the memory modules 310 to 340 at step S140, in order to maintain consistency of data between the memory buffer 100 and the memory space 300.

If it is determined at step S110 that the corresponding entry space does not exist in the register file 120, the control unit 110 determines whether the request is a read command, at step S200.

If the command for the first address is a read command, the control unit 110 outputs a read command to the first address of the memory modules 310 to 340 at step S210, and reads data.

The address converter 111 determines a second address in the register file 120 corresponding to the first address of the memory space 300, at step S220.

As described above, the address converter 111 converts two first addresses which cannot be simultaneously accessed in the memory space 300, into two second addresses which can be simultaneously accessed in the register file 120.

This operation will be described below in more detail.

The control unit 110 outputs a command for writing data read from the memory modules 310 to 340 to the second address of the register file 120 at step S230.

The control unit 110 outputs the data read from a memory module 310 to 340 to the memory controller 200 at step S240.

At this time, the above-described two steps S230 and S240 may be exchanged in order to improve latency performance.

If it is determined at step S200 that the request is a write command, the address converter 111 determines a second address of the register file 120, corresponding to the first address of the memory space 300, at step S250.

Then, the control unit 110 outputs a write command to the second address of the register file 120 at step S260.

In order to maintain data consistency, the control unit 110 outputs a write command to the first address of the memory module 310 to 340 at step S270.

Hereafter, the case in which the memory modules 310 to 340 are implemented with DRAM having multiple ranks and multiple banks and the memory buffer 100 is implemented with HBM will be taken as an example for describing the conversion operation between first and second addresses.

Figure 4:
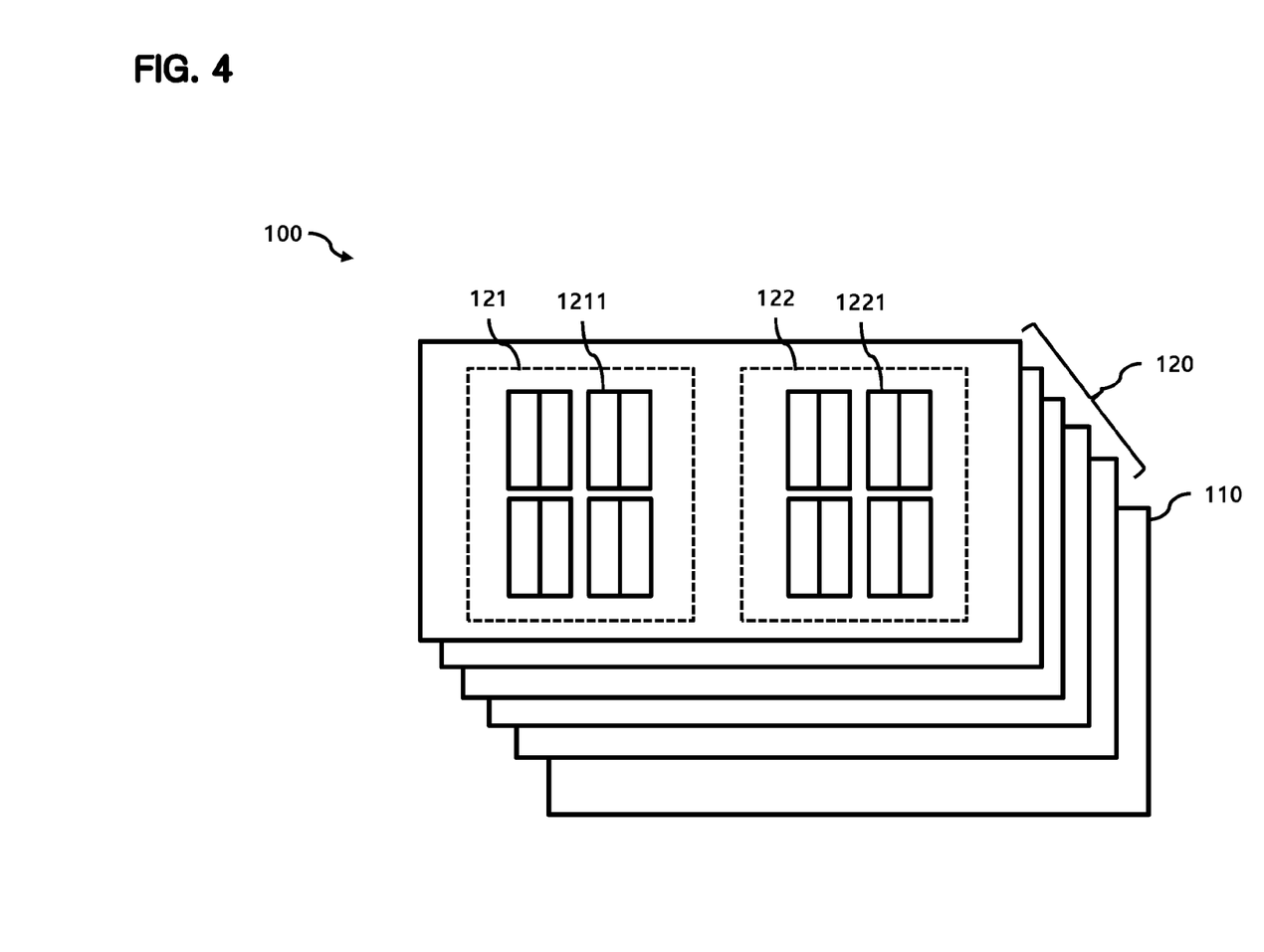
FIG. 4 is a block diagram illustrating an example of a memory buffer of FIG. 2.

FIG. 4 is a diagram for describing the structure of HBM which can be used as the memory buffer of FIG. 2.

In general, HBM includes one logic die and four cell dies. The logic die corresponds to the control unit 110 of FIG. 2, the four cell dies correspond to the register file 120, and the HBM corresponds to the memory buffer 100.

In the HBM, each of the four cell dies 120 includes two channels 121 and 122 which can be independently accessed, and each channel 121 and 122 includes eight banks 1211 and 1221.

Thus, the HBM includes a total of eight channels and eight banks per channel or a total of 16 banks.

The number of cell dies may be expanded to at least eight. In this case, the number of channels may be maintained at eight, and the number of banks per channel may be expanded to 16.

Figure 5:
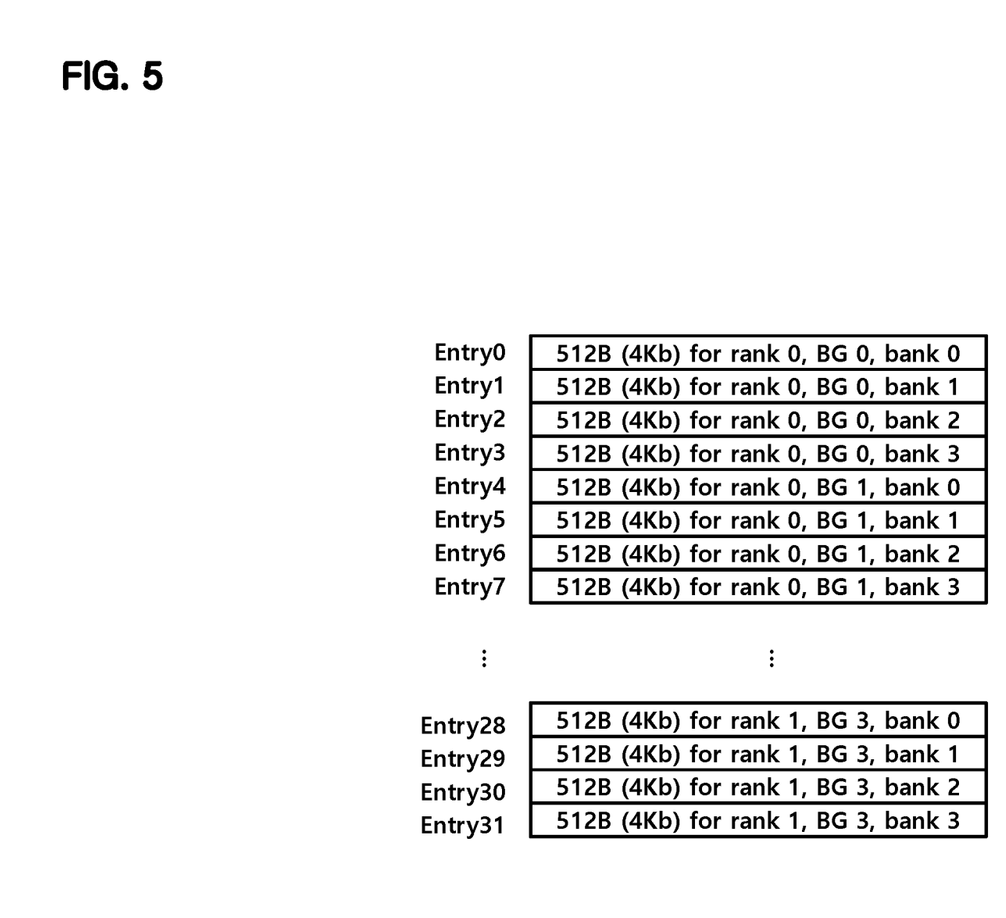
FIG. 5 is a diagram illustrating entries allocated to a bank of FIG. 4.

FIG. 5 illustrates an entry space allocated to a bank of the memory buffer.

As illustrated in FIG. 5, each bank of the register file 120 includes 32 entry spaces (=2 or M ranks×16 or N banks per rank) corresponding to the total number of interleaving units of the memory modules 310 to 340, where each of the entry spaces has a size of 512 bytes corresponding to the size of each interleaving unit, and M and N are natural numbers. Further, the entry spaces may be positioned in different address areas of, for example, the register file 120 where the entry spaces are accessible at the same time.

In the present embodiment, because the register file 120 includes a total of 16 banks, each of the interleaving units of the memory space 300 includes a total of 16 row buffers (entries).

Thus, the number of row addresses which can be simultaneously accessed by one bank was only 1 in the conventional memory system, but is increased to 16 in the present embodiment.

Hereafter, the method for converting a first address of a memory module into a second address of the register file 120 will be described with reference to FIGS. 6 and 7 which illustrate the case in which 4 Gbit HBM per channel is used as the memory buffer and 32 Gbyte DDR4 memory is used as the memory module.

In the memory module, the number of bits per die is 8 Gbit, and the total capacity is 32 Gbyte. Furthermore, the burst length is 8, the data width is 64, the total number of banks is 16, the column address has 10 bits, and the row address has 17 bits.

In the HBM, the burst length is 4, and the data width is 128. Furthermore, the total number of banks is 16, the column address has 14 bits, and the row address has 7 bits.

Thus, the page size becomes 2 Kbyte (=product of number of column addresses and data width).

Figure 6:
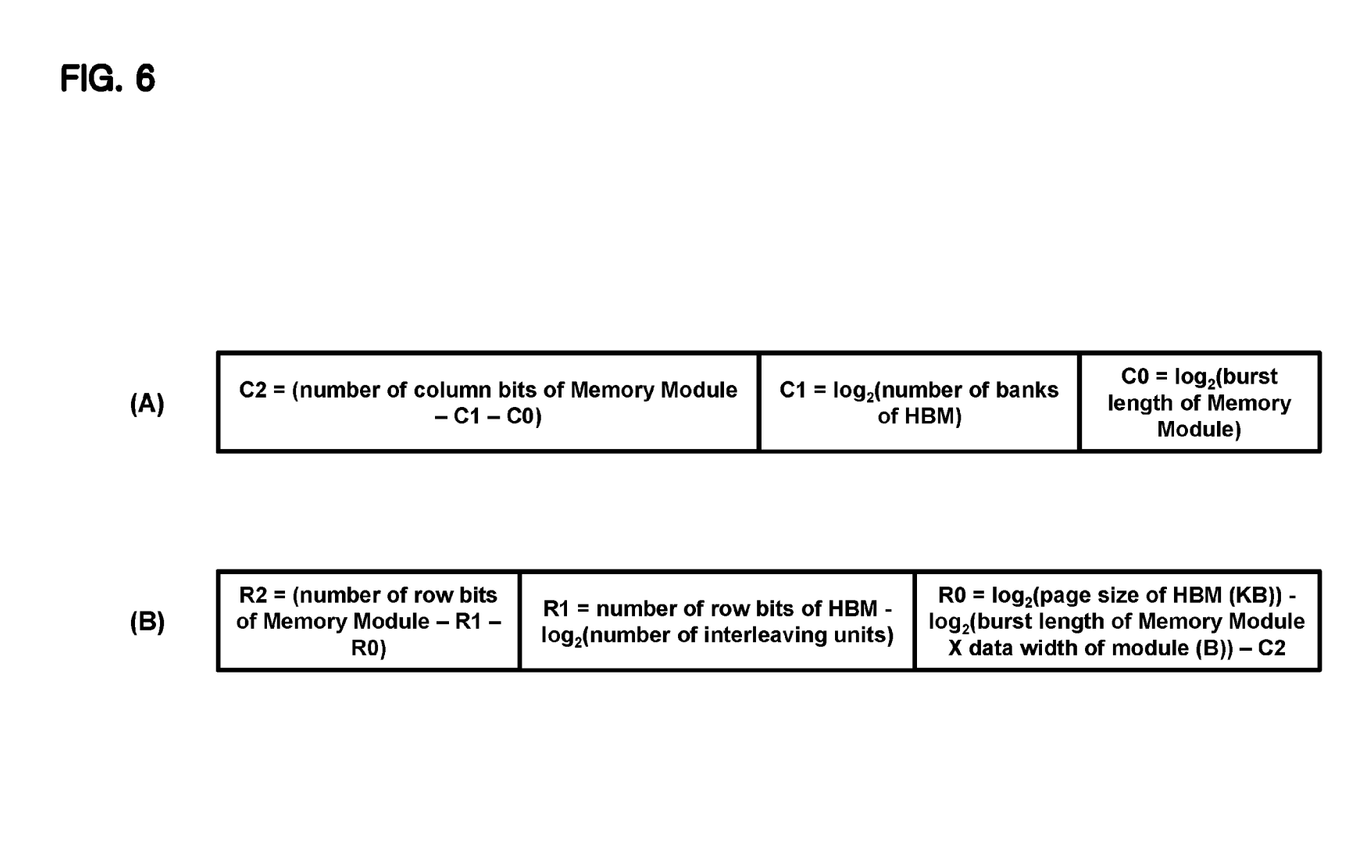
FIGS. 6 and 7 are diagrams for describing an address conversion operation between a memory module and the memory buffer.

As illustrated in FIGS. 6A and 6B, an address of the memory space 300 or a first address includes a column address (FIG. 6A) and a row address (FIG. 6B).

Figure 7:
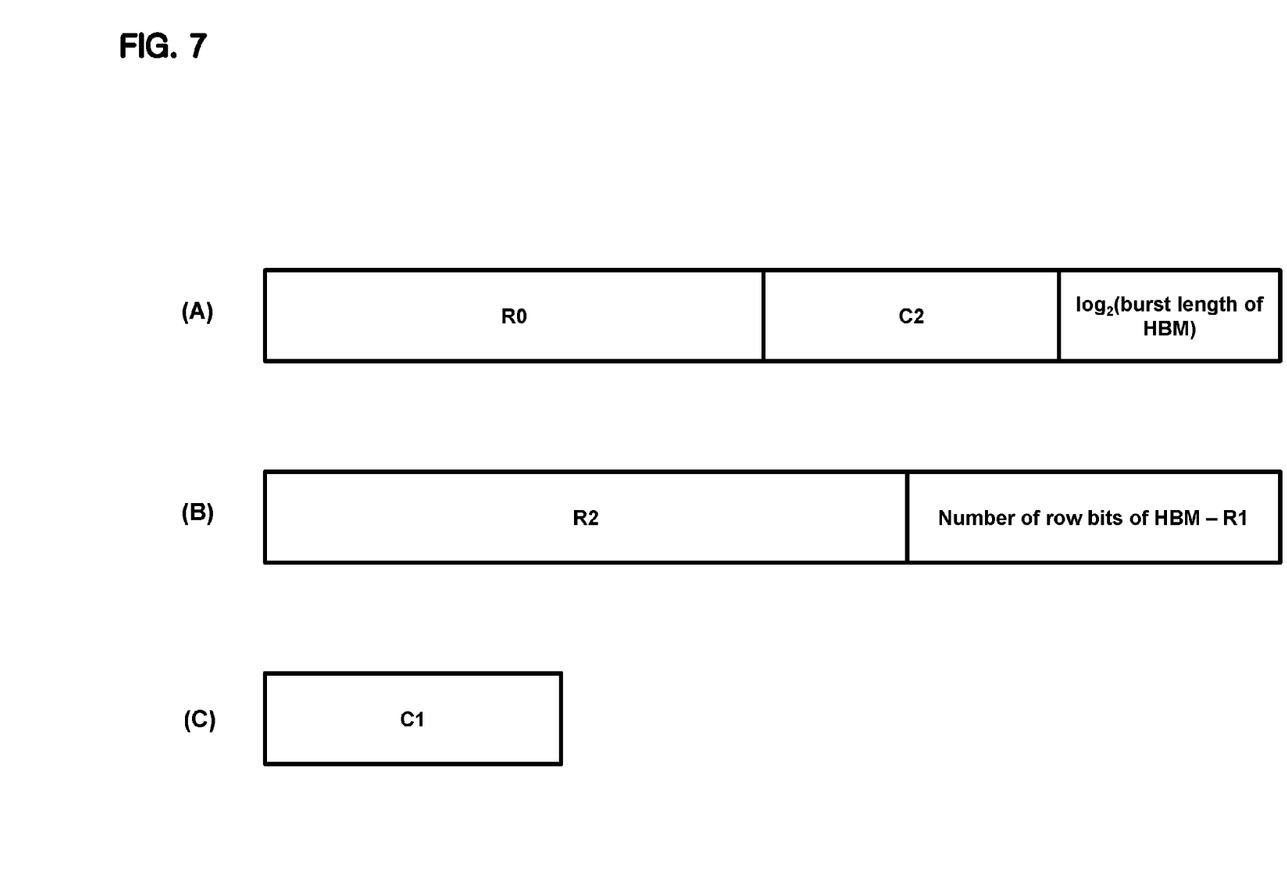

As illustrated in FIGS. 7A to 7C, an address of the HBM memory buffer 100 or a second address includes a column address (FIG. 7A), a row address (FIG. 7B), and a bank address (FIG. 7C).

As illustrated in FIGS. 6 and 7, the first address may be divided into six sub-addresses C2, C1, C0, R2, R1 and R0, and the sub-addresses may be combined to generate the second address.

As illustrated in FIGS. 6A and 6B, the first row address of the first address may be divided into a 10th row address R0, an 11th row address R1, and a 12th row address R2, and the first column address of the first address may be divided into a 10th column address C0, an 11th column address C1 and a 12th column address C2.

Referring to FIG. 7A, the division of the first column address will be described.

First, the number of least significant bits in the first column address or the bit number of the 10th column address C0 indicates the burst length of the memory module, which is expressed as a bit number.

The number of middle bits in the first column address or the bit number of the 11th column address C1 corresponds to the number of banks included in the HBM 100.

The number of most significant bits in the first column address or the bit number of the 12th column address C2 corresponds to a value obtained by subtracting the bit numbers of the 10th and 11th column addresses C0 and C1 from the bit number of the first column address.

Referring to FIG. 6B, the division of the first row address will be described.

First, the number of least significant bits in the first row address or the bit number of the 10th row address R0 corresponds to a value which is obtained by subtracting a bit number corresponding to a product of the burst length and the data width of the memory module from the bit number corresponding to the page size of the HBM and then subtracting the bit number of the 10th column address C0.

Then, the number of middle bits in the first row address or the bit number of the 11th row address R1 corresponds to a value obtained by subtracting the bit number corresponding to the number of interleaving units from the bit number corresponding to the number of row addresses in the HBM 100.

The number of most significant bits in the first row address or the bit number of the 12th column address R2 corresponds to a value obtained by subtracting the bit numbers of the 10th and 11th row addresses R1 and R0 from the bit number of the first row address.

Thus, the bit numbers of C2, C1, C0, R2, R1, and R0 are calculated as follows.

Bit number of C0=$\log_2 8$=3
Bit number of C1=$\log_2 16$=4
Bit number of C2=10−4−3=3
Bit number of R0=$\log_2 2K - \log_2(8*64/8)$−3=11−6−3=2
Bit number of R1=$\log_2 16K - \log_2(16*2)$=14−5=9
Bit number of R2=17−2−9=6

The process of generating the second address from the first address based on the above-described equations is performed as follows.

As illustrated in FIG. 7A, the second column address of the second address sequentially includes the tenth row address R0, the 12th column address C2 and the bit number corresponding to the burst length of the HBM 100.

As illustrated in FIG. 7B, the second row address of the second address sequentially includes the 12th row address R2 and the bits for distinguishing the interleaving units.

The second bank address of the second address corresponds to the value of the 11th column address C1.

Thus, the bit number of the second column address becomes 7 (=2+3+2), the bit number of the second row address becomes 11 (=6+$\log_2(16*2)$), and the bit number of the second bank address becomes 4.

The bit number of the second row address is 11 which is smaller than the row bit number of 14 in the HBM.

This indicates that the second row address can be allocated within the capacity range provided by the HBM.

When specification of the HBM is fixed, the number of address sets which can be simultaneously accessed in the HBM is fixed. Thus, the number of interleaving units may be estimated to have an inverse relationship with the number of row buffers which can be allocated to each interleaving unit.

More specifically, referring to FIGS. 6B and 7B, when the number of interleaving units is increased, R1 is decreased. Thus, when the bit number of the second row address is decreased and the number of interleaving units is decreased, the bit number of the second row address is increased, which makes it possible to confirm that the above estimation is established.

The relationship between FIGS. 6 and 7 will be described in more detail as follows.

The bit number of the second column address in FIG. 7A is expressed in Equation 1 below.

Bit number of second column address=$R2+C2+\log_2$(burst length of HBM)     [Equation 1]

Referring to FIG. 6B, the bit number of the second column address is expressed as Equation 2 below.

Bit number of second column address=$\log_2$(page size(KB) of HBM)−$\log_2$(burst length of memory module×data width (B) of memory module)+$\log_2$(burst length of HBM)     [Equation 2]

The page size of the HBM is set to a product of the column bit number of the HBM and the data width of the HBM.

Thus, the bit number of the second column address in FIG. 7A may be expressed as Equation 3 below.

Bit number of second column address=(column bit number of HBM)+$\log_2$(data width of HBM×burst length of HBM)−$\log_2$(burst length of memory module×data width (B) of module)     [Equation 3]

In Equation 3, since the sizes of data corresponding to accesses need to be equal, the value of $\log_2$(data width of HBM×burst length of HBM) needs to be equal to the value of $\log_2$(burst length of memory module×data with (B) of module).

Thus, Equation 4 is established.

Bit number of second column address=column bit number of HBM     [Equation 4]

When the address conversion is performed through Equation 4 as illustrated in FIGS. 6 and 7, the bit number of the second column address becomes equal to the column bit number of the HBM.

The bit number of the second row address in FIG. 7B is expressed as Equation 5 below.

Bit number of second row address=$R2$+(row bit number of HBM)−$R1$     [Equation 5]

In FIG. 7B, the bit number of the second row address needs to be equal to or less than the row bit number of the HBM. When Equation 5 is applied, the condition of Equation 6 needs to be satisfied.

$R2 <= R1$     [Equation 6]

Referring to FIG. 6B, Equations 7 and 8 are established.

$R1$=(row bit number of HBM)−$\log_2$(number of interleaving units)     [Equation 7]

$R2$=(row bit number of memory module)−$R1$−$R0$     [Equation 8]

According to Equations 6, 7 and 8, Equation 9 is established.

$$\frac{\text{Row bit number of memory module} - R0}{2} + \log_2(\text{number of } interleaving units) <= (\text{row } bitnumber \text{ of } HBM)$$

Since the bit number of the second row address needs to be equal to or less than the row bit number of the HBM, the value of the left side of Equation 9 can be designed to be equal to the bit number of the second row address.

Equation 9 may indicate the bit number of the second address depends on the specification of the HBM or the memory module or particularly the row bit number of the memory module or the number of interleaving units, when the bit number of the second address is designed according to the rules exemplified in FIGS. 6 and 7.

Hereafter, referring to FIG. 8, a performance difference between the present embodiment in which the number of row buffers is increased by the memory buffer 100 and the conventional memory system in which the number of row buffers is 1 and will be described.

First, suppose that the following read access to the memory space is repeated 100 times.

"Bank0, Row 1→Bank 0, Row 2→Bank 9, Row 3"

Figure 8:
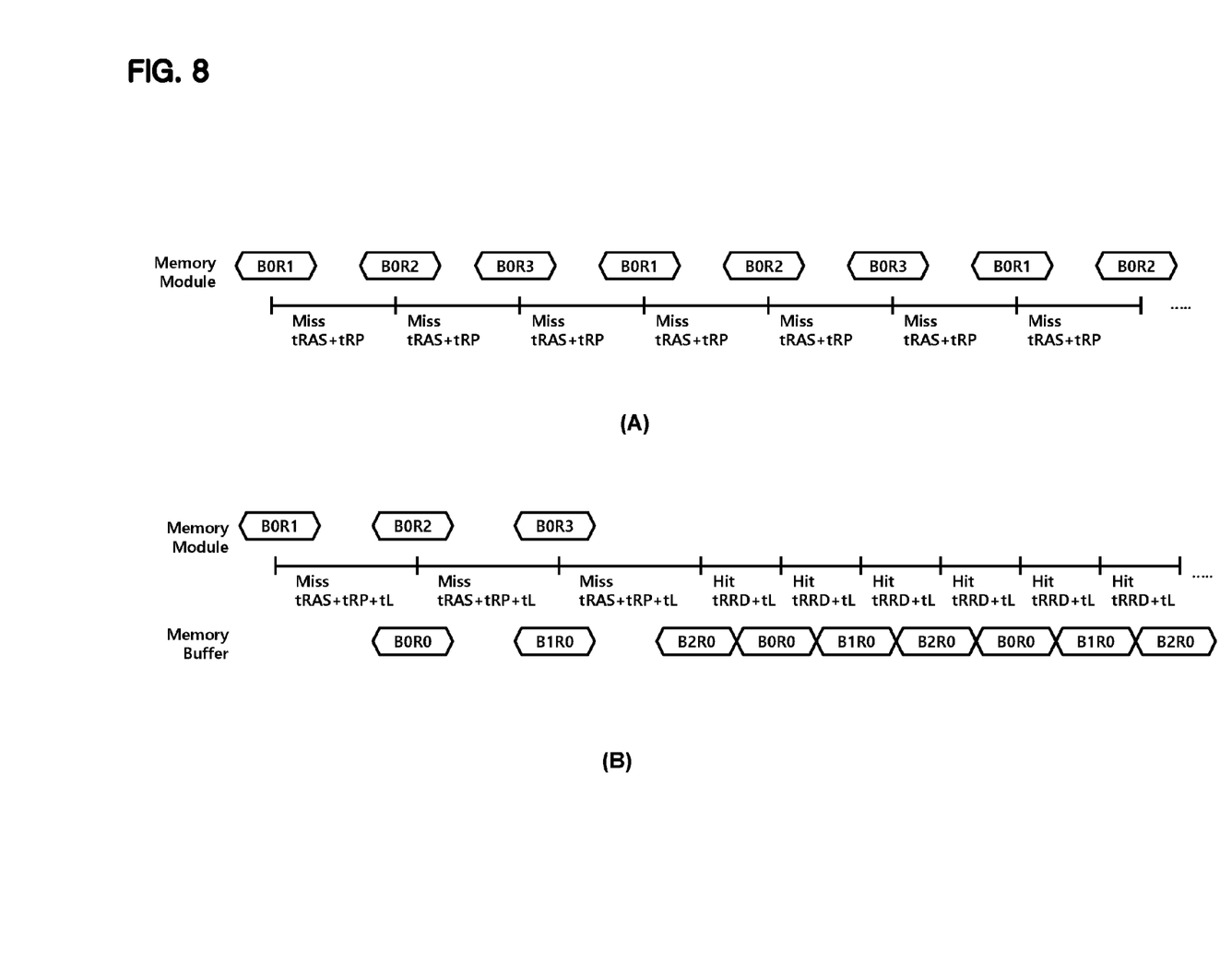
FIG. 8 is a diagram for describing an effect of the present embodiment.

As illustrated in FIG. 8A, a row miss occurs each time in the conventional memory system, but as illustrated in FIG. 8B, a hit continuously occurs from the second time.

Thus, in the present embodiment, only the register file may be accessed from the second time, instead of the memory module.

That is, during the access process to the register file for the second time, row active time tRAS and row precharge time tRP do not need to be repeated, but only row active to row active delay tRRD may be performed.

In this case, since tRRD is 5 ns and the sum of tRAS and tRP is 50 ns, a reliable latency reduction effect can be acquired in the present embodiment.

Furthermore, suppose that a time required for determining whether a row hit occurs in the register file is about 10 ns, and tRCD and clock latency CL are set to 15 ns and 15 ns, respectively. In this case, the performance improvement effect of the present embodiment becomes about 3.22 times.

Entire latency in conventional memory system=3*(tRAS+tRP)*99+2*(tRAS+tRP)+row cycle end time tRCE+tCL~14.98us Entire latency in present embodiment=3*(tRAS+tRP+tL)+99*3(tRRD+tL)+CL~4.65us In accordance with the present embodiment, the memory system may include the memory buffer having the addressable register file, and prevent performance degradation which may occur during a read and write operation for the memory module, through address conversion between an address for the memory module and an address for the register file, thereby improving the performance of the memory system.

Although various embodiments have been described for illustrative purposes, it will be apparent to those skilled in the art that various changes and modifications may be made without departing from the spirit and scope of the disclosure as defined in the following claims.

The semiconductor devices and/or a memory system above (see FIGS. 1-8) are particularly useful in the design of memory devices, processors, and computer systems. For example, referring to FIG. 9, a block diagram of a system employing a semiconductor device and/or a memory system in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

Figure 9:
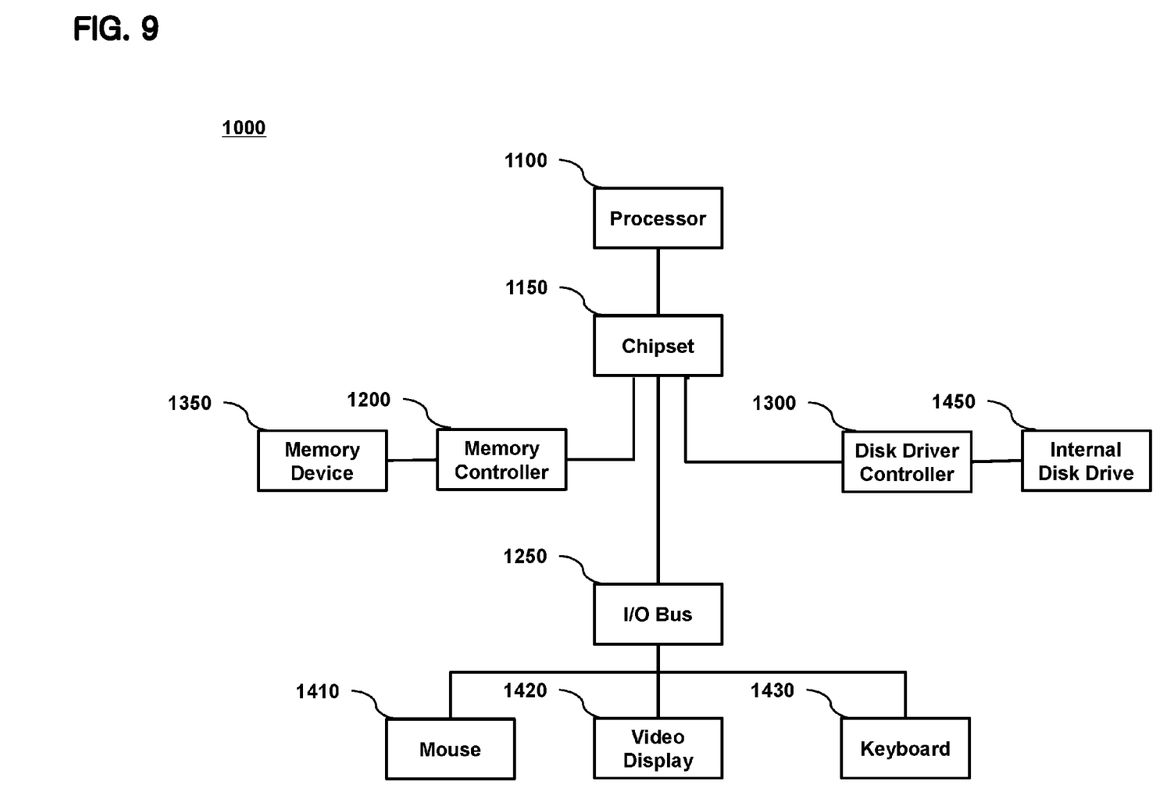
FIG. 9 illustrates a block diagram of an example representation of a memory system in accordance with the various embodiments discussed above with relation to FIGS. 1-8.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor device and/or a memory system as discussed above with reference to FIGS. 1-8. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device and/or a memory system as discussed above with relation to FIGS. 1-8, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal storage disk driver 1450 may facilitate disconnection of the external data devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 9 is merely one example of a system 1000 employing a semiconductor device and/or a memory system as discussed above with relation to FIGS. 1-8. In alternate embodiments, such as, for example but not limited to, cellular phones or digital cameras, the components may differ from the embodiments illustrated in FIG. 9.

What is claimed is:

1. A memory system comprising:
a memory module accessed based on a first address;
a memory controller configured to provide a read or write command for the memory module according to a host request; and
a memory buffer accessed based on a second address,
wherein the memory buffer comprises a register file having two or more entry spaces corresponding to interleaving units of the memory module, and the two or more entry spaces are positioned in different address areas which are accessible at the same time.

2. The memory system of claim 1, wherein the memory buffer comprises a control unit configured to convert the first address into the second address and control a read or write operation for the register file according to the second address.

3. The memory system of claim 2, wherein the control unit comprises an address converter configured to convert the first address into the second address.

4. The memory system of claim 2, wherein when a second address corresponding to the first address exists in the register file, the control unit performs the read or write command on the register file.

5. The memory system of claim 4, wherein when the write command is performed on the register file, the control unit further performs a write command on the memory module of the first address.

6. The memory system of claim 2, wherein when a second address corresponding to the first address does not exist in the register file, the control unit converts one address of the two or more entry spaces corresponding to the first address into the second address.

7. The memory system of claim 6, wherein when a command for the first address is a read command, the control unit provides a read command to the memory module, and provides a command to write data read from the memory module to the second address of the register file.

8. The memory system of claim 7, wherein the control unit outputs the data read from the memory module to the memory controller.

9. The memory system of claim 6, wherein when a command for the first address is a write command, the control unit provides a write command to the first address of the memory module, and provides a write command to the second address of the register file.

10. The memory system of claim 1, wherein the memory module is a first DRAM (dynamic random access memory) memory module, and the memory buffer is a second DRAM.

11. The memory system of claim 10, wherein the first DRAM memory module comprises M ranks and N banks per rank, and the number of interleaving units is M×N, where M and N are natural numbers.

12. The memory system of claim 11, wherein the second DRAM comprises a plurality of banks which are independently accessible, and each of the banks comprises a plurality of entry spaces corresponding to the number of interleaving units.

13. The memory system of claim 10, wherein the memory module is a DDR (double data rate) memory module, and the second DRAM is an HBM (High-Bandwidth Memory).

14. A method comprising:
accessing a memory module based on a first address;
providing a read or write command for the memory module by a memory controller;
accessing a memory buffer based on a second address, wherein the memory buffer comprises a register file having two or more entry spaces corresponding to interleaving units of the memory module, and the two or more entry spaces are positioned in different address areas which are accessible at the same time.

15. The method of claim 14 further comprising converting by a control unit of the memory buffer the first address into the second address, and controlling a read or write operation for the register file according to the second address.

16. The method of claim 15 further comprising converting by an address converter of the control unit the first address into the second address.

17. The method of claim 15 further comprising performing the read or write command on the register file by the control unit when a second address corresponding to the first address exists in the register file.

18. The method of claim 15 further comprising converting one address of the two or more entry spaces corresponding to the first address into the second address when a second address corresponding to the first address does not exist in the register file.

19. The method of claim 14, wherein the memory module is a first DRAM (dynamic random access memory) memory module, and the memory buffer is a second DRAM.

20. The method of claim 14, wherein the memory module is a DDR (double data rate) memory module, and the memory buffer is an HBM (High-Bandwidth Memory).

* * * * *